United States Patent
Taylor

(10) Patent No.: US 10,301,221 B1
(45) Date of Patent: May 28, 2019

(54) MATERIALS, DEVICES, AND METHODS FOR PRODUCING STRONG MAGNETIC-FLUX PINNING IN SUPERCONDUCTING MATERIALS BY INCLUDING SITES HAVING HIGH ELECTRONIC EFFECTIVE MASS AND CHARGE CARRIER DENSITY

(71) Applicant: SPAWAR Systems Center Pacific, San Diego, CA (US)

(72) Inventor: Benjamin J. Taylor, Escondido, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 310 days.

(21) Appl. No.: 15/270,233

(22) Filed: Sep. 20, 2016

(51) Int. Cl.
  *C04B 35/45* (2006.01)
  *C04B 35/63* (2006.01)
  *C04B 37/00* (2006.01)

(52) U.S. Cl.
  CPC ...... *C04B 35/4508* (2013.01); *C04B 35/6303* (2013.01); *C04B 37/005* (2013.01); *C04B 2235/3201* (2013.01); *C04B 2235/3208* (2013.01); *C04B 2235/3215* (2013.01); *C04B 2235/3225* (2013.01); *C04B 2235/3227* (2013.01); *C04B 2235/3282* (2013.01); *C04B 2235/3289* (2013.01); *C04B 2235/79* (2013.01); *C04B 2237/06* (2013.01); *C04B 2237/34* (2013.01); *C04B 2237/74* (2013.01)

(58) Field of Classification Search
  CPC ............ C04B 35/4508; C04B 35/6303; C04B 37/005
  See application file for complete search history.

(56) References Cited

U.S. PATENT DOCUMENTS

| | | | |
|---|---|---|---|
| 5,279,852 | A | 1/1994 | Clough et al. |
| 5,348,797 | A | 9/1994 | Clough et al. |
| 5,603,983 | A | 2/1997 | Clough et al. |
| 5,683,969 | A | 11/1997 | Masur et al. |
| 5,756,207 | A | 5/1998 | Clough et al. |
| 5,874,175 | A | 2/1999 | Li |
| 6,172,009 | B1 | 1/2001 | Smith et al. |
| 6,310,297 | B1 | 10/2001 | Masur et al. |
| 6,413,589 | B1 | 2/2002 | Li |
| 6,610,428 | B2 | 8/2003 | Smith et al. |

(Continued)

OTHER PUBLICATIONS

"Pinning in Type II Superconductors," Larkin et al., J. Low Temperature Physics, V. 34, Nos. 314, pp. 449-428 (1979).

(Continued)

*Primary Examiner* — Paul A Wartalowicz
(74) *Attorney, Agent, or Firm* — SPAWAR Systems Center Pacific; Kyle Eppele

(57) ABSTRACT

A superconducting material having a strong magnetic-flux pinning by way of sites having high electronic effective mass and charge carrier density. The superconducting material involves a superconducting host material and a dopant pinning material being inert in relation to the superconducting host material and has a $\sqrt{\rho}/m^*$ in a range less than that of the superconducting host material, the dopant pinning material doping the superconducting host material.

10 Claims, 5 Drawing Sheets

(56) References Cited

U.S. PATENT DOCUMENTS

| | | | |
|---|---|---|---|
| 7,463,915 | B2 | 12/2008 | Thieme et al. |
| 7,496,390 | B2 | 2/2009 | Thieme et al. |
| 7,622,424 | B2 | 11/2009 | Li et al. |
| 7,674,751 | B2 | 3/2010 | Malozemoff et al. |
| 7,893,006 | B2 | 2/2011 | Huang et al. |
| 7,902,120 | B2 | 3/2011 | Rupich et al. |
| 8,030,246 | B2 | 10/2011 | Otto et al. |
| 8,195,260 | B2 | 6/2012 | Otto et al. |
| 8,263,531 | B2 | 9/2012 | Otto et al. |
| 8,354,136 | B2 | 1/2013 | Li et al. |
| 8,362,220 | B2 | 1/2013 | Girolami et al. |
| 8,748,349 | B2 | 6/2014 | Goyal et al. |
| 2002/0182451 | A1 | 12/2002 | Smith et al. |
| 2005/0159298 | A1 | 7/2005 | Rupich et al. |
| 2006/0094603 | A1 | 5/2006 | Li et al. |
| 2007/0179063 | A1 | 8/2007 | Malozemoff et al. |
| 2008/0153709 | A1 | 6/2008 | Rupich et al. |
| 2009/0233800 | A1 | 9/2009 | Huang et al. |
| 2009/0298696 | A1 | 12/2009 | Otto et al. |
| 2010/0022396 | A1 | 1/2010 | Otto et al. |
| 2010/0048406 | A1 | 2/2010 | Rupich et al. |
| 2010/0112192 | A1 | 5/2010 | Li et al. |
| 2010/0168404 | A1 | 7/2010 | Girolami et al. |
| 2012/0010084 | A1 | 1/2012 | Otto et al. |
| 2012/0264612 | A1 | 10/2012 | Goyal et al. |
| 2013/0129593 | A1 | 5/2013 | Girolami et al. |
| 2016/0348257 | A1* | 12/2016 | Yagi .................. C25B 11/0463 |

OTHER PUBLICATIONS

Blatter et al., "Quantum melting of the vortex lattice in high-Tc superconductors," Phys. Rev. Lett., 70, 2621, Apr. 26, 1993.

Blatter et al., "Quantum statistical mechanics of vortices in high-temperature superconductors," Phys. Rev. B50, 10272, Oct. 1, 1994.

MacManus-Driscoll et al., "Strongly enhanced current densities in superconducting coated conductors of YBa2Cu3O7—x+BaZrO3," Nature Materials 3, 439, May 30, 2004.

Taylor et al., "Role of quantum fluctuations in the vortex solid to vortex liquid transition of type-II superconductors," Phys. Rev. B76, 014517, Jul. 24, 2007.

Taylor et al., "Evolution and analysis of the vortex solid to vortex liquid melting line in Y1—xPrxBa2Cu3O6.97 and YBa2Cu3O6.5 to 45 tesla," Phys. Rev. B76, 014517, Jul. 24, 2007.

Tanaka et al., "Heavy-Mass Behavior of Ordered Perovskites ACu3Ru4O12 (A=Na, Ca, La)," J. Phys. Soc. Jpn. 78, 024706, Jan. 26, 2009.

Maiorov et al., "Synergetic combination of different types of defect to optimize pinning landscape using BaZrO3-doped YBa2Cu3O7," Nature Materials 8, 398, Apr. 6, 2009.

"Quenching quantum vortex fluctuations in order to achieve higher critical current densities in MBa2Cu3Ox coated conductors," Physica C, 469, Issues 23-24, pp. 2016-2020, 2009.

Golubchik et al., "Mass of a vortex in a superconducting film measured via magneto-optical imaging plus ultrafast heating and cooling," Phys. Rev B, 85, 060504(R), Feb. 13, 2012.

Prando et al., "Evidence for a vortex-glass transition in superconducting Ba9Fe0.9Co0.1)2As2," J. Phy.: Condensed Matter, 25, Nov. 25, 2015.

* cited by examiner

MATERIALS, DEVICES, AND METHODS FOR PRODUCING STRONG MAGNETIC-FLUX PINNING IN SUPERCONDUCTING MATERIALS BY INCLUDING SITES HAVING HIGH ELECTRONIC EFFECTIVE MASS AND CHARGE CARRIER DENSITY

FEDERALLY-SPONSORED RESEARCH AND DEVELOPMENT

The United States Government has ownership rights in the subject matter of the present disclosure. Licensing inquiries may be directed to the Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 102,882.

BACKGROUND OF THE INVENTION

Technical Field

The present disclosure technically relates to superconducting materials. Particularly, the present disclosure technically relates to superconducting materials having a strong magnetic flux pinning.

Description of Related Art

Flux-Pinning is generally defined as the phenomenon where a magnet's lines of force (called flux) become trapped or "pinned" inside a superconducting material. This pinning binds the superconductor to the magnet at a fixed distance. Flux-pinning is only possible when there are defects in the crystalline structure of the superconductor—usually resulting from grain boundaries or impurities. In the related art, large and randomly arranged pinning centers (single-particle) have been observed to cause a strong deformation of a flux line lattice, wherein each pinning center acts on the lattice with a maximum force, in relation to superconductors. The average force for such pinning is inferable from a simple summing procedure. Pinning centers of average force, such as clusters of dislocations, strongly deform the flux line lattice only in weak fields and in fields close to the critical field, wherein a peak exists in the dependence of the critical current on magnetic field. In a range of intermediate fields, a weak collective pinning exists. A large concentration of weak centers results in collective pinning in all fields, wherein, near the critical field, a critical current peak is observed.

Challenges experienced in the related art of high-temperatures superconductors include successfully retaining a dissipation-free state while carrying large electrical currents. The controlled combination of two effective pinning centers (randomly distributed nanoparticles and self-assembled columnar defects) has been observed. By changing the temperature or growth rate during pulsed-laser deposition of barium zirconium oxide-($BaZrO_3$)-doped yttrium barium copper oxide ($YBa_2Cu_3O_7$) films, the ratio of these self-assembled columnar defects is variable by tuning the field and angular critical-current ($I_c$) performance to maximize $I_c$. The self-assembled columnar defects' microstructure involves a mixture of splayed columnar defects and random nanoparticles. The very high $I_c$ arises from a complex vortex pinning landscape, wherein columnar defects provide large pinning energy, and wherein splay and nanoparticles inhibit flux creep. The related art has used the foregoing observations to produce thick films with higher $I_c(H)$ and nearly isotropic angle dependence.

All related art high-$T_c$ materials are type-II superconductors. As such, when these related art high-$T_c$ materials are in the presence of a sufficiently high magnetic field, the magnetic field penetrates the material in physically distinct quantized topological structures known as magnetic-flux lines or vortices. The material within the vortex core is then forced into the normal state. The flow of an electrical super-current through the material exerts a force on the vortices, which, if free to move, will then dissipate energy resulting in the destruction of the dissipation-less conductive state. Some natural defects may occur within related art high-$T_c$ materials, which serve as natural pinning sites for vortices, because of weakening or completely suppressing the superconducting state within the volume of these sites, however, the random nature of these natural defects provides only random pinning strength at these sites.

In the related art, reaching a high critical current density has been a major challenge and most of the focus has been on merely optimizing the geometry of the pinning landscape. Therefore, a need exists in the related art for the development of materials, devices, and methods for producing strong magnetic-flux pinning in superconducting materials using alternative techniques.

SUMMARY

The present disclosure involves superconducting materials. In accordance with an embodiment of the present disclosure, an enhanced superconducting material, having a magnetic-flux pinning by way of sites having high electronic effective mass m* and charge carrier density p, and methods of making the same are disclosed. The enhanced superconducting material is comprised of a superconducting host material and a dopant pinning material. The dopant pinning material being inert in relation to the superconducting host material wherein the value of the relationship between the square root of the electronic resistivity, ρ, and the effective mass, m* ($\sqrt{\rho}/m^*$) is in a range less than that of the superconducting host material. The method of making such an enhanced superconducting material includes applying or doping the dopant pinning material doping on to the superconducting host material. By specifically configuring the dopant pinning material, the superconducting material of the present disclosure yields a uniform material configured to increase pinning strength for vortices by way of structuring the functionality and ordering pinning sites in a superconducting host material.

BRIEF DESCRIPTION OF THE DRAWINGS

The above, and other, aspects, features, and benefits of several embodiments of the present disclosure are further understood from the following Detailed Description of the Drawing as presented in conjunction with the following several figures of the Drawing.

Figure 1:
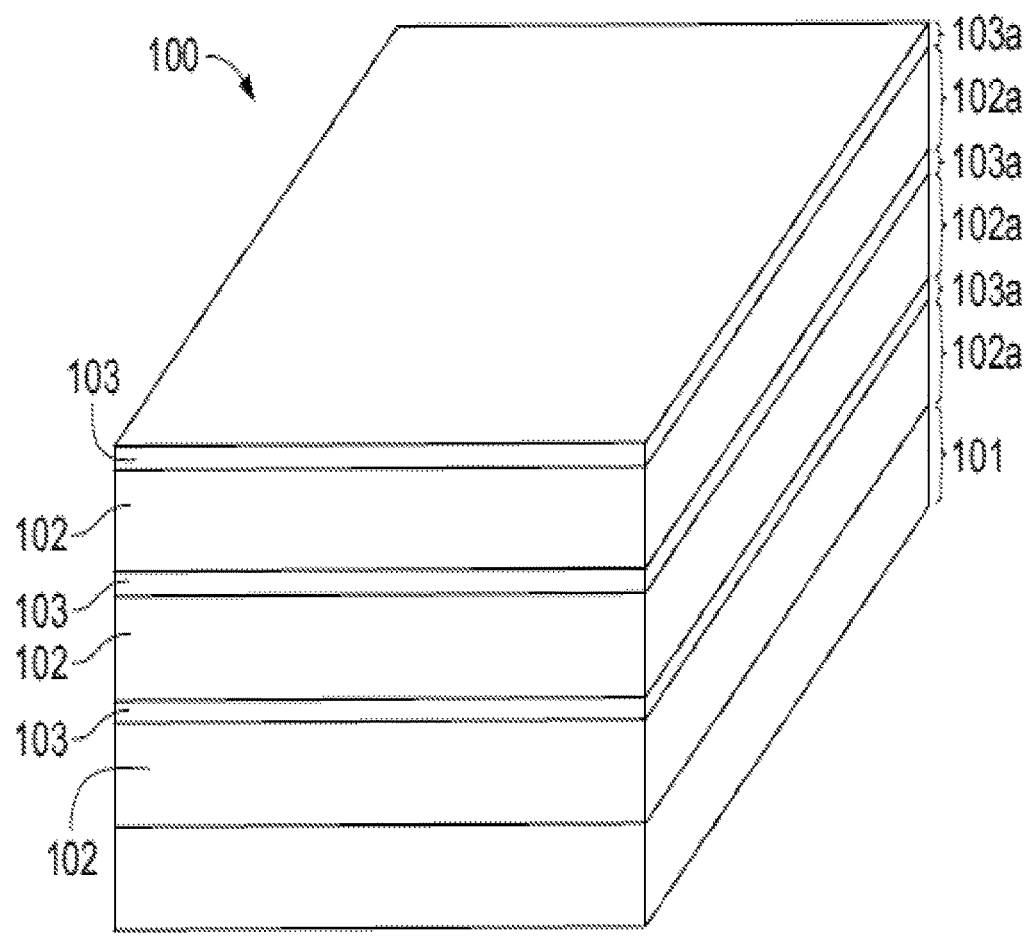
FIG. 1 is a diagram illustrating a perspective view of a superconducting material having magnetic-flux pinning by way of sites having high electronic effective mass and charge carrier density, in accordance with an embodiment of the present disclosure.

Corresponding reference numerals or characters indicate corresponding components throughout the several figures of the Drawing. Elements in the several figures are illustrated for simplicity and clarity and have not necessarily been drawn to scale. For example, the dimensions of some of the elements in the figures may be emphasized relative to other elements for facilitating understanding of the various presently disclosed embodiments. Also, common, but well-understood, elements that are useful or necessary in commercially feasible embodiment are often not depicted in order to facilitate a less obstructed view of these various embodiments of the present disclosure.

DETAILED DESCRIPTION OF THE EMBODIMENT(S)

Referring to FIG. 1, this diagram illustrates, in a perspective view, a superconducting material 100 having magnetic-flux pinning by way of sites having high electronic effective mass $m^*$ and charge carrier density $\rho$, in accordance with an embodiment of the present disclosure. The superconducting material 100 comprises: a superconducting host material 102 and a dopant pinning material 103 being inert in relation to the superconducting host material 102. Wherein the value of the relationship between the square root of the electronic resistivity, $\rho$, and the effective mass, $m^*$ ($\sqrt{\rho}/m^*$) is in a range less than that of the superconducting host material 102 The dopant pinning material 103 is used for doping the superconducting host material 102. The superconducting material 100 further comprises a substrate 101, wherein the substrate 101 comprises at least one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), yttria-($Y_2O_3$)-stabilized zirconia ($ZrO_2$) (YSZ), or any other suitable substrate material. A suitable substrate material comprises at least one characteristic of: a structurally matching lattice interface, a melting point in a range of at least approximately 800° C., a non-reactive chemical composition, or at least one insulating electrical property.

Still referring to FIG. 1A, the dopant pinning material 103 comprises an A-site ordered perovskite oxide, whereby the superconducting host material 102 is configurable to exhibit heavy fermion behavior at pinning sites therein. The A-site ordered perovskite oxide comprises a form of A copper rubidium oxide ($ACu_3Ru_4O_{12}$), wherein A comprises at least one of an alkaline earth metal, a rare-earth metal, and at least one other element, such as an alkali metal, yttrium (Y), cadmium (Cd), scandium (Sc), and lanthanum (La), and wherein B comprises a transition metal. The superconducting host material 102 comprises a high-$T_c$ compound, wherein the high-$T_c$ compound comprises at least one of another form of yttrium barium copper oxide ($YBa_2Cu_3O_{7-\delta}$) and any material, such as a form of barium copper oxide having a compositional form of $R_{1-y}M_yBa_2Cu_{3-z}T_zO_x$, wherein 6≤x≤7, wherein 0≤y≤1, wherein 0≤z≤1, wherein R comprises at least one of a rare earth and calcium, wherein M comprises at least one of a rare earth distinct from that of R and calcium if absent from R, wherein T comprises at least one of cobalt (Co), iron (Fe), nickel (Ni), and zinc (Zn). The A-site ordered perovskite oxide comprises $ACu_3Ru_4O_{12}$, wherein A comprises one of sodium (Na), calcium (Ca), and lanthanum (La). The high-$T_c$ compound, comprising $YBa_2Cu_3O_{7-\delta}$, comprises $YBa_2Cu_3O_{6.96}$.

Still referring to FIG. 1, the superconducting host material 102 comprises a plurality of superconducting material layers 102a, each superconducting material layer 102a of the plurality of superconducting material layers 102a comprising a thickness in a range of approximately 5 lattice constants to approximately 20 lattice constants, in accordance with an embodiment of the present disclosure. The dopant pinning material 103 comprises a thin interlayer 103a disposed between each superconducting material layer 102a of the plurality of superconducting material layers 102, the thin interlayer 103a configurable as at least one of a top layer formed on each superconducting material layer 102a and as separately formed interlayer, and the thin interlayer 103a comprising a thickness in a range of approximately 1 lattice constant to approximately 10 lattice constants.

Figure 2:
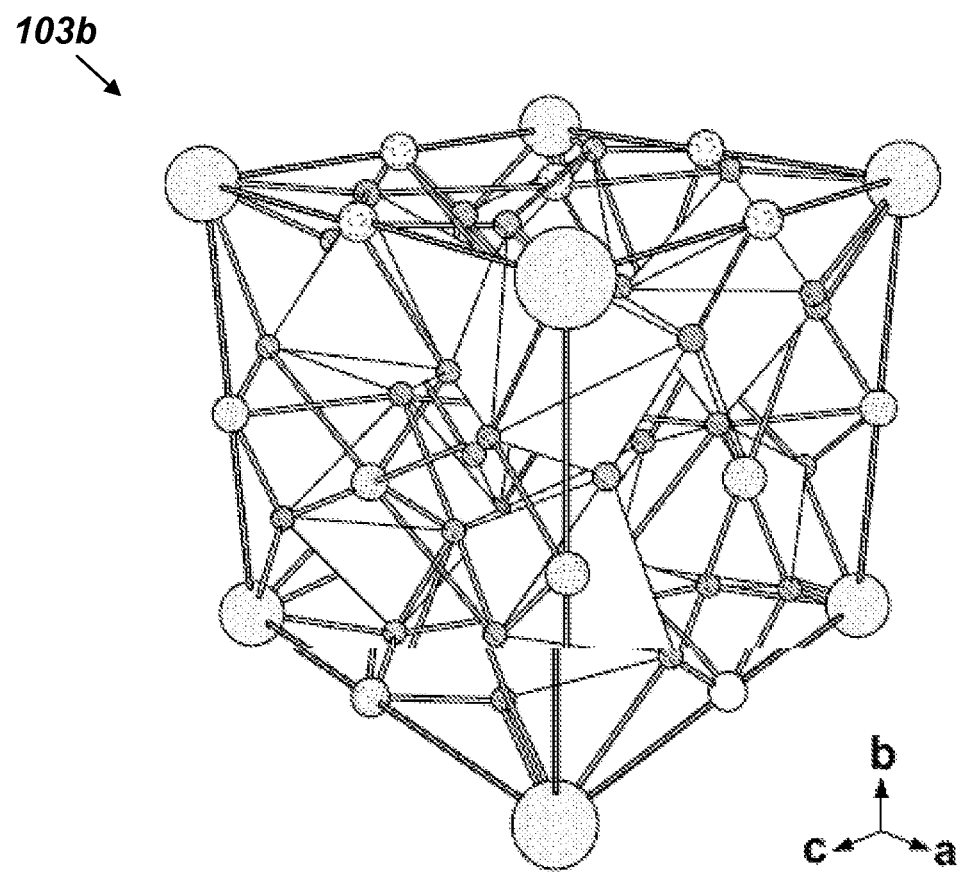
FIG. 2 is a diagram illustrating a perspective view of a lattice structure in the dopant pinning material, such as configured in a thin interlayer, in accordance with an embodiment of the present disclosure.

Still referring to FIG. 1, under the proper conditions, e.g., wherein the dopant pinning material 103 is chemically inert in relation to the superconducting host material 102, and wherein the ratio of $\sqrt{\rho}/m^*$ of the dopant pinning material 103 is less than that of the superconducting host material 102, the materials, devices, and methods of the present disclosure are utilizable for increasing the current-carrying capacity, e.g., the critical current density, of any superconducting material of the present disclosure in at least one form, such as a bulk polycrystalline form, a single crystal form, and a thin film form, wherein $m^*$=the electronic effective mass, and wherein $\rho$=charge carrier density (FIG. 2).

Still referring to FIG. 1, the superconducting materials of the present disclosure comprise properties, such as entering into an electronically ordered state, thereby supporting the transport of an electrical current without any dissipation of energy, e.g., the value of the electrical resistivity of the superconducting materials goes to zero when below a critical temperature $T_c$. The superconducting materials of the present disclosure have strong magnetic flux pinning and are utilizable in numerous technological applications, whereby such technological applications will benefit or become viable with a sufficient increase over existing values in the related art.

Referring to FIG. 2, this diagram illustrates, in a perspective view, a lattice structure 103b of the dopant pinning material 103, such as configured in the thin interlayer 103a, in accordance with an embodiment of the present disclosure. The superconducting host materials 102 of the present disclosure have strong magnetic flux pinning may comprise type-II superconductors capable of transferring to a mixed state, e.g., a flux line lattice, in a sufficiently strong magnetic field. The critical current in this state is determined by the pinning force, e.g., by a flux line lattice interaction with non-homogeneities of the superconducting materials. Two types of pinning-force dependence on the magnetic field exist. For strong pinning, the pinning-force dependence has a smooth, wide maximum at fields in a range of approximately $0.3H_{c2}$ to approximately $0.5H_{c2}$. For weak pinning, usually in a wide range of fields, the pinning force weakly depends on the magnetic field; and, only near $H_{c2}$, the pinning force has a narrow and very high maximum, e.g., a "peak effect" is utilized.

Figure 3:
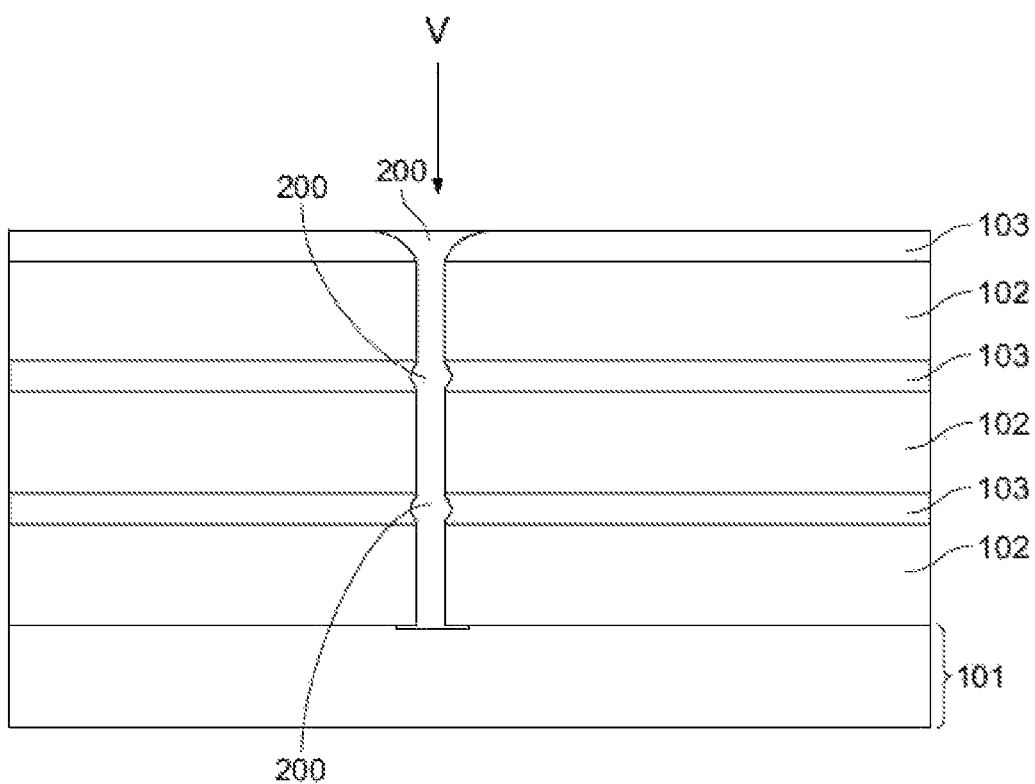
FIG. 3 is a diagram illustrating a cross-sectional view of a superconducting material having a magnetic-flux pinning by way of sites having high electronic effective mass and charge carrier density, as shown in FIG. 2, in accordance with an embodiment of the present disclosure.
Figure 4:
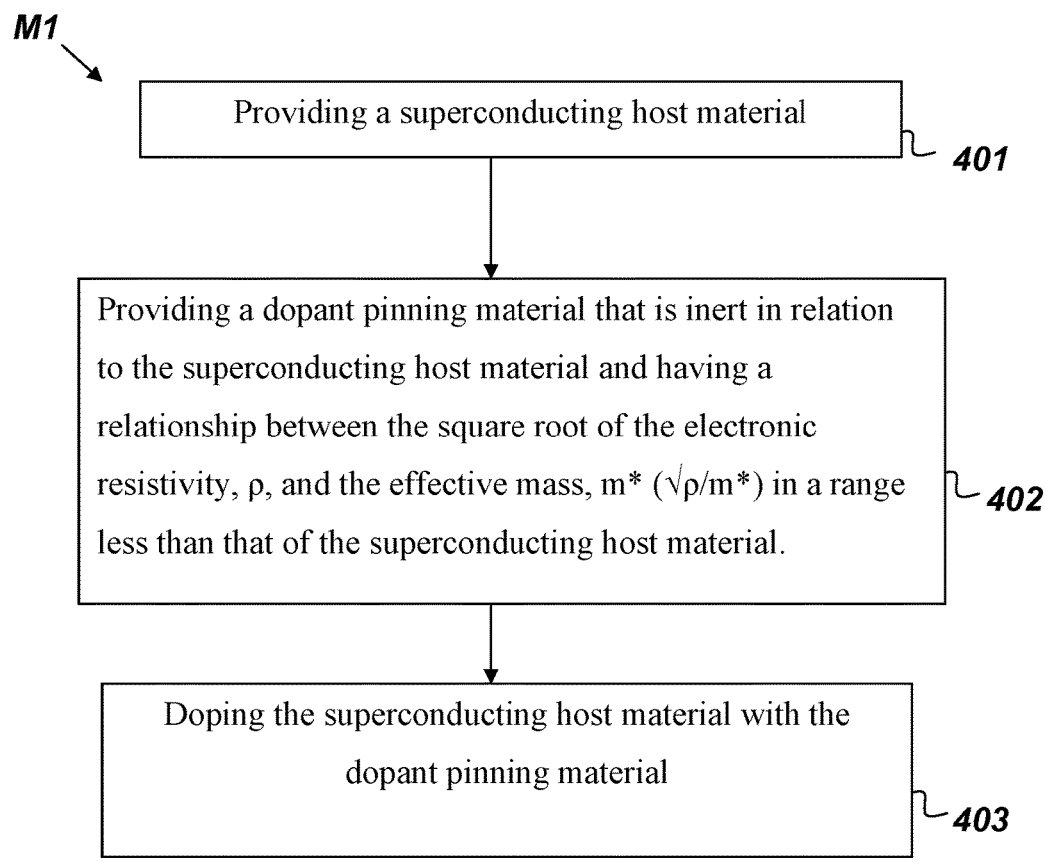
FIG. 4 is flow diagram illustrating a method of synthesizing a superconducting material having a magnetic-flux pinning by way of sites having high electronic effective mass and charge carrier density, in accordance with an embodiment of the present disclosure

Referring to FIG. 3, this diagram illustrates, in a cross-sectional view, a superconducting material 100 having a strong magnetic-flux pinning by way of sites having high electronic effective mass m* and charge carrier density ρ, as shown in FIG. 1, in accordance with an embodiment of the present disclosure. In accordance with embodiments of the present disclosure, the materials, devices, and methods generally involve a distinct manner of controlling the quantum fluctuations of vortices in order to realize a significant increase in the current-carrying capacity of a superconducting material in the presence of a magnetic field. Such control is performed by directly increasing the effective quantum mechanical mass of pinned magnetic vortices 200 through the introduction of non-reactive materials as point, line, and volume imperfections, e.g., $Q \sim \sqrt{\rho_N}/m^*$, wherein Q=the effective quantum mechanical mass, wherein $\rho_N$=charge carrier density within a vortex core V, and wherein m*=electronic effective mass within the vortex core V. In accordance with the present disclosure, the dopant pinning material 103 exhibit bulk properties of relatively low electronic resistivity, ρ, and a large electronic effective mass, m*. To achieve an enhancement in the effective pinning strength of the defect, e.g., at a pinned magnetic vortex 200, the ratio of $\sqrt{\rho}/m^*$ of the dopant pinning material 103 is less than that of the superconducting host material 102 in the normal state $\sqrt{\rho_N}/m^*$ at magnetic fields and temperatures above approximately the upper critical field $H_{c2}(T)$.

Still referring to FIG. 2, in accordance with embodiments of the present disclosure, the materials, devices, and methods generally involve minimizing vortex excitations that arise from quantum fluctuations. In a high-$T_c$ superconductor, the strength of excitations from quantum fluctuations comprises comparable magnitude or even exceeds those of thermal fluctuations under certain circumstances. With the inclusion of a "dopant" material, such as the dopant pinning material 103, as a source of defects whose electronic properties are such that quantum fluctuations can be heavily suppressed, the materials, devices, and methods provide an enhancement of the critical current density by an order of magnitude beyond what is provided by the geometric suppression of thermal fluctuations alone, e.g., an enhanced pining pinning of the vortex core V in the thin interlayer 103a, the thin interlayer 103a comprising a heavy fermion layer, wherein "heavy" related relates to the quantum mechanical mass.

Referring back to FIGS. 1, 2, and 3, in accordance with embodiments of the present disclosure, the materials, devices, and methods generally involve are useable for any combination of materials, wherein the dopant pinning material 103 comprises the following features: (1) inert in relation to the superconducting host material 102, and (2) $\sqrt{\rho}/m^*$ is less than that of the superconducting host material 102. The use of the A-site ordered perovskite oxides of the form $ACu_3B_4O_{12}$, wherein A comprises at least one of an alkaline earth metal, a rare-earth metal, and at least one other element, and wherein B comprises a transition metal, whereby superconducting host material 102 is configurable, by doping, by way of the dopant pinning material 103, to exhibit heavy fermion behavior as pinning sites, such as pinned magnetic vortices 200, therein, e.g., within a high-$T_c$ compound, such as $YBa_2Cu_3O_{7-\delta}$, wherein δ is a number in a range of approximately 0 to approximately 1. The materials, devices, and methods involve using heavy fermion compounds $ACu_3Ru_4O_{12}$, wherein A comprises one of sodium (Na), calcium (Ca), and lanthanum (La). For comparison, in $YBa_2Cu_3O_{6.96}$, the quantity $\sqrt{\rho_N}/m^*$ is approximately 1.8; and, in $ACu_3Ru_4O_{12}$, wherein A comprises one of Na, Ca, La, the quantity $\sqrt{\rho}/m^*$ is, respectively, approximately 0.11, approximately 0.22, and approximately 0.34.

Still referring back to FIGS. 1, 2 and 3, in an embodiment, a superconducting material 100 comprises a multilayer film, the multilayer film comprising a plurality of superconducting host material layers 102a; and a thin interlayer 103a disposed between each superconducting host material layer 102a of the plurality of superconducting material host layers 102a, wherein the thin interlayer 103a is configurable as one of a top layer grown on each superconducting host material layer 102a and as separately formed thin interlayer 103a. A requirement for this approach is that the two materials, e.g., the dopant pining material 103 and the superconducting host material layer 102a, are structurally compatible as in relation to the foregoing fermion compounds.

Still referring back to FIGS. 1, 2, and 3, in accordance with an embodiment of the present disclosure, a superconducting material 100 with a strong magnetic-flux pinning by way of sites, such as pinned magnetic vortices 200, having high electronic effective mass m* and charge carrier density ρ, the superconducting material 100 comprises a superconducting host material 102; and a dopant pinning material 103 being inert in relation to the superconducting host material 102 and having a $\sqrt{\rho}/m^*$ in a range less than that of the superconducting host material 102, the dopant pinning material 103 doping the superconducting host material 102.

Still referring back to FIGS. 1, 2, and 3, in accordance with an embodiments of the present disclosure, the dopant pinning material comprises an A-site ordered perovskite oxide, whereby the superconducting host material is configurable to exhibit heavy fermion behavior as pinning sites therein, the A-site ordered perovskite oxide comprises a form of $ACu_3B_4O_{12}$, A comprises at least one of an alkaline earth metal, a rare-earth metal, and at least one other element, B comprises a transition metal, the superconducting host material comprises a high-$T_c$ compound, the high-$T_c$ compound comprises $YBa_2Cu_3O_{7-\delta}$, the A-site ordered perovskite oxide comprises $ACu_3Ru_4O_{12}$, A comprising one of Na, Ca, and La, and the high-$T_c$ compound, comprising $YBa_2Cu_3O_{7-\delta}$, comprises $YBa_2Cu_3O_{6.96}$. The high-$T_c$ compound comprises at least one of $YBa_2Cu_3O_{7-\delta}$ and any material having a compositional form of $R_{1-y}M_yBa_2Cu_{3-z}T_zO_x$, wherein 6≤x≤7, wherein 0≤y≤1, wherein 0≤z≤1, wherein R comprises at least one of a rare earth and calcium, wherein M comprises at least one of a rare earth distinct from that of R and calcium if absent from R, and wherein T comprises at least one of cobalt, iron, nickel, and zinc.

Still referring back to FIGS. 1, 2, and 3, the present disclosure involves materials, devices, and methods for producing strong magnetic-flux pinning in superconducting materials, such as the superconducting material 100, by including sites, such as pinned magnetic vortices 200, having high electronic effective mass m* and charge carrier density ρ. An approach of the present disclosure comprises countering vortex excitations resulting from quantum fluctuations. The superconducting materials 100 (high-$T_c$ materials) of the present disclosure have numerous potential applications for at least that the superconducting materials 100 achieve certain technological benchmarks, such as reaching a high critical current density, wherein the high critical current density is the maximum amount of electrical current that can be passed through a unit cross-sectional area of a superconducting material in a dissipation-less state.

Still referring back to FIGS. 1, 2, and 3, in accordance with an embodiment of the present disclosure, the superconducting material 100 with a strong magnetic-flux pinning by way of sites, such as pinned magnetic vortices 200, having high electronic effective mass m* and charge carrier density ρ, comprises: a superconducting host material 102 and a dopant pinning material 103 being inert in relation to the superconducting host material 102 and has a $\sqrt{\rho}/m*$ in a range less than that of the superconducting host material 102; and the dopant pinning material 103 doping the superconducting host material 102, wherein the dopant pinning material 103 is specifically configured, e.g., synthesized, whereby the superconducting material 100 overcomes many of the challenges in the related art, e.g., in a uniform material configured to increase pinning strength for vortices, such as pinned magnetic vortices 200, by way of structuring the functionality and ordering pinning sites in a superconducting host material 102.

Referring to FIGS. 1, 2, 3 and 4, the present disclosure provides a method M1 of synthesizing a superconducting material 100 with a strong magnetic-flux pinning by way of sites having high electronic effective mass and charge carrier density, in accordance with an embodiment of the present disclosure. The method M1 comprises: providing a superconducting host material, as indicated by block 401; providing a dopant pinning material that is inert in relation to the superconducting host material and having a $\sqrt{\rho}/m*$ in a range less than that of the superconducting host material, as indicated by block 402; and doping the superconducting host material with the dopant pinning material, as indicated by block 403.

Still referring to FIGS. 1, 2, 3 and 4, providing a dopant pinning material, as indicated by block 402, comprises providing an A-site ordered perovskite oxide, whereby the superconducting host material is configurable to exhibit heavy fermion behavior as pinning sites therein. Furthermore, providing the A-site ordered perovskite oxide comprises providing a form of $ACu_3B_4O_{12}$, providing a form of $ACu_3B_4O_{12}$ comprises providing A as at least one of an alkaline earth metal, a rare-earth metal, and at least one other element, providing a form of $ACu_3B_4O_{12}$ comprises providing B as a transition metal. Providing the superconducting host material comprises providing a high-$T_c$ compound, providing the high-$T_c$ compound comprises providing $YBa_2Cu_3O_{7-\delta}$, providing the A-site ordered perovskite oxide comprises providing $ACu_3Ru_4O_{12}$, wherein A comprises one of Na, Ca, and La, and providing the high-$T_c$ compound, comprising providing $YBa_2Cu_3O_{7-\delta}$, comprises providing $YBa_2Cu_3O_{6.96}$. The high-$T_c$ compound comprises at least one of $YBa_2Cu_3O_{7-\delta}$ and any material having a compositional form of $R_{1-y}M_yBa_2Cu_{3-z}T_zO_x$, wherein 6≤x≤7, wherein 0≤y≤1, wherein 0≤z≤1, wherein R comprises at least one of a rare earth and calcium, wherein M comprises at least one of a rare earth distinct from that of R and calcium if absent from R, and wherein T comprises at least one of cobalt, iron, nickel, and zinc.

Figure 5:
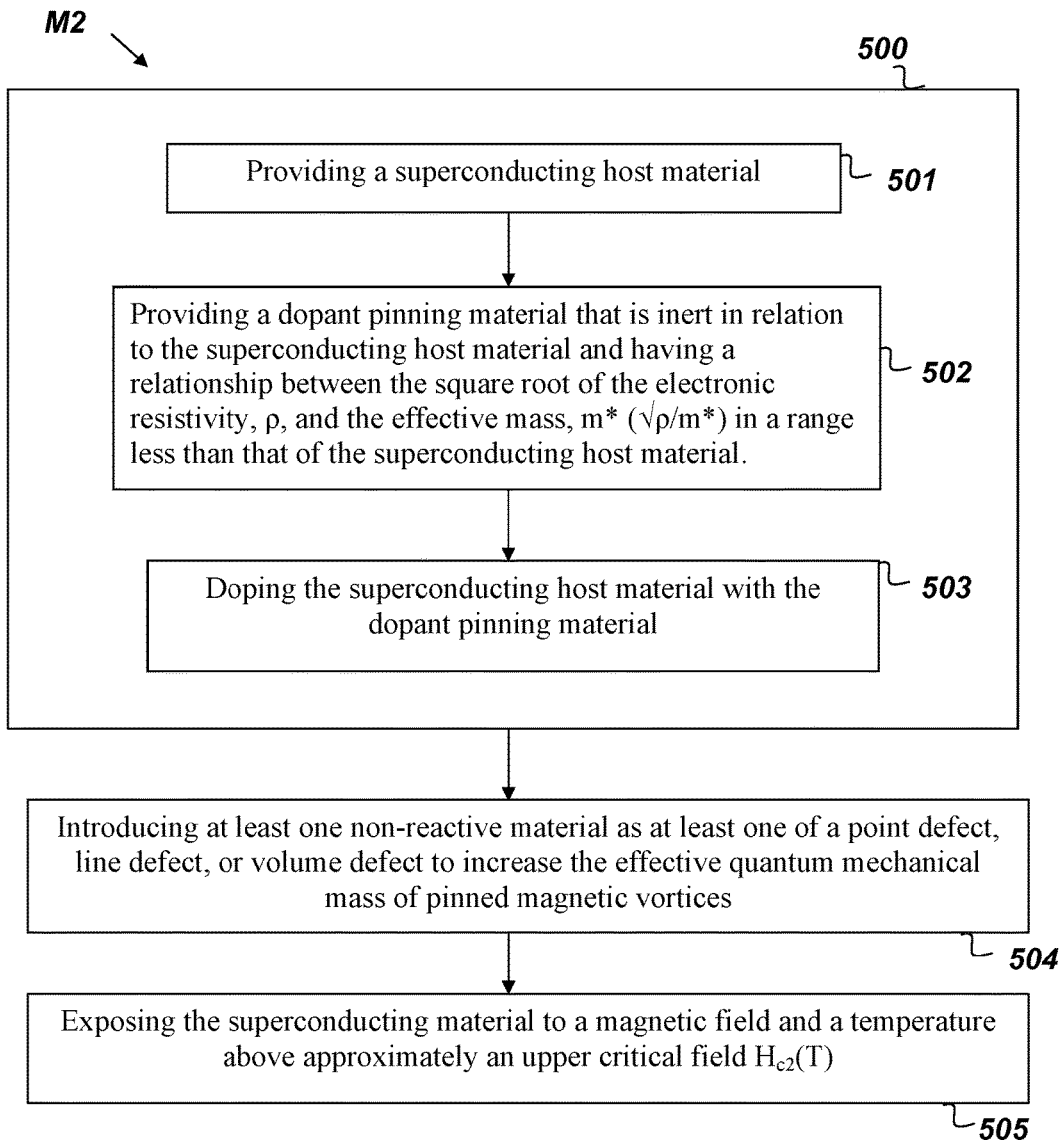
FIG. 5 is a flow diagram illustrating a method of increasing a current-carrying capacity of a superconducting material by controlling the quantum fluctuations of vortices in the presence of a magnetic field, in accordance with an embodiment of the present disclosure.

FIG. 5, discloses a method M2 of increasing a current-carrying capacity of a superconducting material by controlling the quantum fluctuations of vortices in the presence of a magnetic field, in accordance with an embodiment of the present disclosure. The method M2 comprises: providing a superconducting material with a strong magnetic-flux pinning, as indicated by block 500, which provides superconducting material that comprises: providing a superconducting host material as indicated by block 501; providing a dopant pinning material that is inert in relation to the superconducting host material and having a $\sqrt{\rho}/m*$ in a range less than that of the superconducting host material, as indicated by block 502; and doping the superconducting host material with the dopant pinning material, as indicated by block 503; and directly increasing the effective quantum mechanical mass of pinned magnetic vortices by introducing at least one non-reactive material as at least one of a point defect, a line defect, and a volume defect, as indicated by block 504. The method M2 further comprises exposing the superconducting material to a magnetic field and a temperature above approximately an upper critical field $H_{c2}(T)$, as indicated by block 505, whereby an effective pinning strength of a defect is enhanced, thereby increasing the current-carrying capacity of the superconducting material.

It is understood is that many additional changes in the details, materials, steps and arrangement of parts, which have been herein described and illustrated to explain the nature of the invention, may be made by those skilled in the art within the principle and scope of the invention as expressed in the appended claims.

What is claimed:

1. A superconducting material with a strong magnetic-flux pinning by way of sites having high electronic effective mass and charge carrier density, the superconducting material comprising:
    a superconducting host material; and
    a dopant pinning material being inert in relation to the superconducting host material, the dopant material having a ratio of a square root of an electronic resistivity to an effective mass in a range less than that of the superconducting host material when in a normal state at temperatures above approximately an upper critical field $H_{c2}(T)$, the dopant pinning material doping the superconducting host material, whereby effective pinning strength of a defect is enhanced.

2. The superconducting material of claim 1, wherein the dopant pinning material comprises an A-site ordered perovskite oxide, whereby the superconducting host material is configurable to exhibit heavy fermion behavior at pinning sites therein.

3. The superconducting material of claim 2, wherein the A-site ordered perovskite oxide comprises a form of $ACu_3B_4O_{12}$.

4. The superconducting material of claim 3, wherein A comprises at least one of an alkaline earth metal, a rare-earth metal, and at least one other element of an alkali metal, yttrium, cadmium, scandium, and lanthanum.

5. The superconducting material of claim 3, wherein B comprises a transition metal.

6. The superconducting material of claim 3, wherein the A-site ordered perovskite oxide comprises $ACu_3Ru_4O_{12}$, wherein A comprises one of Na, Ca, and La.

7. The superconducting material of claim 1, wherein the superconducting host material comprises a high-$T_c$ compound.

8. The superconducting material of claim 7, wherein the high-$T_c$ compound comprises at least one of $YBa_2Cu_3O_{7-\delta}$ and any material having a compositional form of $R_{1-y}M_yBa_2Cu_{3-z}T_zO_x$, wherein 6≤x≤7, wherein 0≤y≤1, wherein 0≤z≤1, wherein R comprises at least one of a rare earth and calcium, wherein M comprises at least one of a rare earth distinct from that of R and calcium if absent from R, and wherein T comprises at least one of cobalt, iron, nickel, and zinc.

9. The superconducting material of claim 8, wherein the high-$T_c$ compound, comprising $YBa_2Cu_3O_{7-\delta}$, comprises $YBa_2Cu_3O_{6.96}$.

10. The superconducting material of claim 1,
wherein the superconducting host material comprises a plurality of superconducting material layers, each superconducting material layer of the plurality of superconducting material layers comprising a thickness in a range of approximately 5 lattice constants to approximately 20 lattice constants, and
wherein the dopant pinning material comprises a thin interlayer disposed between each superconducting material layer of the plurality of superconducting material layers, the thin interlayer configurable as at least one of a top layer formed on each superconducting material layer and as separately formed interlayer, and the thin interlayer comprising a thickness in a range of approximately 1 lattice constant to approximately 10 lattice constants.

* * * * *